US006657569B2

United States Patent
Barnett

(10) Patent No.: US 6,657,569 B2
(45) Date of Patent: Dec. 2, 2003

(54) CANONICAL HUFFMAN ENCODED DATA DECOMPRESSION ALGORITHM

(75) Inventor: Mark L. Barnett, Kirkland, WA (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 10/054,807

(22) Filed: Jan. 22, 2002

(65) Prior Publication Data

US 2003/0006918 A1 Jan. 9, 2003

Related U.S. Application Data

(60) Provisional application No. 60/281,568, filed on Apr. 4, 2001.

(51) Int. Cl.[7] .............................................. H03M 7/40
(52) U.S. Cl. .............................. 341/65; 341/67; 341/50
(58) Field of Search ........................... 341/67, 65, 106; 382/232, 248; 704/200

(56) References Cited

U.S. PATENT DOCUMENTS 5,253,325 A * 10/1993 Clark ........................ 704/200
5,696,507 A * 12/1997 Nam ......................... 341/67
5,883,975 A *  3/1999 Narita et al. ................ 382/232
5,982,306 A * 11/1999 Nam ......................... 341/67
6,043,765 A    3/2000 Twardowski ................ 341/65
6,160,918 A * 12/2000 Pigeon ....................... 382/248
6,320,523 B1 * 11/2001 York et al. .................. 341/106

* cited by examiner

Primary Examiner—Jean Bruner Jeanglaude
(74) Attorney, Agent, or Firm—Charles J. Rupnick

(57) ABSTRACT

A decompression algorithm for parallel decompression of compressed canonical Huffman encoded data by providing a fast peripheral to decompress the data, thereby off-loading the main processor to do other work in contrast to the prior art devices and methods. The decompression algorithm also provides for multiple dedicated decompression peripherals to further increase decompression performance in applications having multiple data requesters. The decompression algorithm is optionally implemented in hardware to provide parallel processing of decompression operations that is much faster than traditional software solutions because multiple parallel paths and functional blocks are utilized to rapidly accomplish the decompression.

30 Claims, 4 Drawing Sheets

CANONICAL HUFFMAN ENCODED DATA DECOMPRESSION ALGORITHM

This application claims the benefit of U.S. Provisional Application Ser. No. 60/281,568, filed in the name of Mark L. Barnett on Apr. 4, 2001, the complete disclosure of which is incorporated herein by reference.

FIELD OF THE INVENTION

The present invention relates to digital signal processing, and more particularly to digital signal decompression.

BACKGROUND OF THE INVENTION

The advancement of fast computers in recent years has caused a large capacity of data to be treated in the computer. Typically, the data are compressed to efficiently use available memory and reduce data transmission times. A variety of data compression methods are known. One compression method, known as Huffman coding, is a form of statistical coding wherein a probability of each data character is translated to a sequence of bits.

Traditional Huffman coding assigns an optimal prefix-free code for each symbol based on a frequency with which each symbol appears in the file. Symbols that appear more frequently are coded in fewer bits. In standard Huffman coding this is accomplished by building a binary tree structure. This tree structure is then used to build the codewords. Decoding the codeword requires that the tree is traversed until the root is reached. Traversing the tree structure requires that the binary tree be stored in the file, and requires numerous accesses to memory as the tree is traversed.

FIG. 1 illustrates one example of the "code tree" generated by the Huffman encoding. Nodes are points marked with a circle O and a square. A line segment connecting the nodes is called a "branch." The node located in the highest position is called a "root." Further, an under node Y connected via the "branch" to a node X is termed a "child" of the node X. Reversely, the node X is referred to as a "parent" of the node Y. A node having no "child" is called a "leaf," and a particular character corresponds to each "leaf." Further, the nodes excluding the "leaves" are referred to as "internal nodes," and the number of "branches" from the "root" down to each "node" is called a level.

When encoded by use of the code tree, a path extending from the "root" down to a target "leaf" (corresponding to a character to be encoded) is outputted as a code. More specifically, "1" is outputted when branching off to the left from each of the nodes from the "root" down to a target "leaf," while "0" is outputted when branching off to the right. For example, in the code tree illustrated in FIG. 1, a code "00" is outputted for a character A corresponding to a "leaf" of a node number 7, and a code "011" is outputted for a character B corresponding to a "leaf" of a node number 8.

When decoded, a character is outputted which corresponds to a "leaf" which is reached by tracing the respective nodes from the "root" in accordance with a value of each bit of code defined as a target for decoding.

In general terms, a Huffman encoding algorithm generates the above-described code tree according to the following:

(1) Leaf nodes corresponding to the individual characters are prepared, and the frequency of occurrence of the characters corresponding to the respective leaves are recorded.

(2) One new node is created for two nodes having the minimum occurrence frequency, and this created node is connected via branches to the two nodes. Further, a sum of the occurrence frequencies of the two nodes connected via the branches is recorded as an occurrence frequency of the newly created node.

(3) The processing set forth in item (2) is executed for the remaining nodes, i.e. the nodes not having parents, until the number of remaining nodes becomes 1.

In the code tree thus generated, a code is allocated to each character with a code length which is inversely proportional to the occurrence frequency of the character. Therefore, when the coding is performed by use of the code tree, it follows that the data can be compressed.

This data must be decompressed before it is used.

The Huffman encoding algorithm was introduced in the early 1950's. In subsequent years it has been characterized, analyzed and expanded to include canonical forms. A canonical Huffman code is an optimal prefix-free code, but the code is not generated using the standard Huffman coding. Instead, Huffman's algorithm is used to calculate the length in bits of each codeword, but a different algorithm is used to determine the actual codewords. The codewords are chosen such that a small look-up table is all that is needed to determine when a codeword has been assembled, then the decoded symbol can be accessed directly from another small look-up table containing the decoded symbols.

As shown in FIG. 2, a canonical Huffman encode file consists of three tables: FIRSTCODE table 1, SYMBOL POINTER table 2, and SYMBOL table 3; and the compressed data. The FIRSTCODE table 1 has one entry assigned to it for each codeword of a given length. For example if the largest codeword length is 10 bits then the FIRSTCODE table 1 would have 10 table entries. The FIRSTCODE table 1 is organized with the code for length 1 first, down to the code for length N. The values in this table are used to determine when a codeword has been built for decoding. Since the codewords are of varying lengths and no delimiter is used, the codeword bit patterns and the FIRSTCODE table 1 allow for determining when the end of a codeword has been reached. The value in the FIRSTCODE table 1 is equal to the minimum integer value of codewords of that bit length. That is, when assembling the bits when the integer value of the assembled bits is greater than or equal to the value in FIRSTCODE, then a valid codeword is available to decode.

The second table, SYMBOL POINTER table 2, contains a pointer to the first decoded symbol for each bit length. The SYMBOL POINTER table 2 contains one word for each bit length.

The SYMBOL table 3 contains the actual decoded symbol value. The length of the SYMBOL table 3 is equal to the number of symbols to decode. The SYMBOL table 3 is a look-up table of the resolved symbols indexed by address.

Each of these three tables is stored in memory. The compressed data are read and the decompression algorithm is used to extract the original data.

FIG. 2 refers to traditional canonical decoding algorithms wherein a LENGTH COUNTER 4 and working value V are reset to 0. A next bit of compressed data is added to V using an addition function 5. Using a comparison function 6, the result of the add function 5 is compared to a FIRSTCODE value selected by the LENGTH COUNTER 4. If the comparison (V>=FIRSTCODE(L)) is FALSE, then the LENGTH COUNTER 4 is incremented; the working value is multiplied by 2 using a left shift operation 7; and the next compressed bit from the compressed data 8 is added to the shifted value. Using the comparison function 6, the resultant is again compared with FIRSTCODE(L). This process is repeated until the comparison (V>=FIRSTCODE(L)) is TRUE.

When the comparison is TRUE, a value from the SYMBOL POINTER table 2 is selected by the LENGTH COUNTER and added to the working value V using an addition function 9. The FIRSTCODE value selected by the LENGTH COUNTER 4 is subtracted using a subtraction function 10, and the resultant value is the address for the SYMBOL Table 3, whereby the SYMBOL is resolved. The algorithm is thus essentially a bit comparison process that can take up to N iterations to resolve the SYMBOL.

The decompression, or "decoding," procedure may be described by the C-language pseudo code in Table 1 below. In the pseudo code, the function performs a traditional canonical Huffman decode algorithm as described above and returns the resolved SYMBOL.

TABLE 1

Traditional Canonical Decompression Algorithm Pseudo Code

Initialize V and the LENGTH COUNTER value L to their base values
Set V to NEXTINPUTBIT() value
While V < FIRSTCODE(L)
   Set V to V * 2 + NEXTINPUTBIT()
   L = L + 1
Return SYMBOL = SYMBOL POINTER TABLE (L) + V − FIRSTCODE(L)

Although effective, this software decompression is time consuming and prevents the software from performing other tasks during decompression.

SUMMARY OF THE INVENTION

The present invention provides a fast means for decompression of compressed canonical Huffman encoded data by providing a fast peripheral to decompress the data, thereby off-loading the main processor to do other work in contrast to the prior art devices and methods. The present invention also provides for multiple dedicated decompression peripherals to further increase decompression performance in applications having multiple data requesters.

The decompression algorithm of the present invention is implemented in hardware to provide parallel processing of decompression operations that is much faster than traditional software solutions because multiple parallel paths and functional blocks are utilized to rapidly accomplish the decompression.

According to one aspect of the invention, the decompression algorithm of the invention is embodied as a decompression device for decompression of compressed canonical Huffman encoded data, wherein a relationship is fixed between FIRSTCODE and the compressed data bits according to FIRSTCODE[0] and bit 0, FIRSTCODE [1]and bits 0, 1, FIRSTCODE[2] and bits 0, 1, 2, through FIRSTCODE [N] and bits 0, 1, 2, . . . N; and a relationship is fixed between FIRSTCODE and SYMBOL POINTER according to FIRSTCODE[0] and SYMBOL POINTER[0], FIRSTCODE[1] and SYMBOL POINTER[1], through FIRSTCODE[N] and SYMBOL POINTER[N]. The device of the invention thus includes: a plurality of FIRSTCODE registers each having a FIRSTCODE value associated therewith; a plurality of SYMBOL POINTER registers each having a SYMBOL POINTER value associated therewith; a plurality of comparators each coupled to a different FIRSTCODE register to accept a FIRSTCODE value therefrom and coupled to accept a string of compressed data bits from a memory device having compressed canonical Huffman encoded data stored therein, the comparators being structured to simultaneously compare the FIRSTCODE values with corresponding bits of the string of compressed data bits; a multiplexer coupled to accept a result of each of the comparators, the multiplexer being structured to sequentially examine the results and to select a successful comparison result; a plurality of addition blocks each coupled to a different one of the SYMBOL POINTER registers, one of the addition blocks being associated with a SYMBOL POINTER register corresponding to one of the FIRSTCODE registers having the successful comparison result and being structured to add the value from the corresponding SYMBOL POINTER register to the string of compressed NEXTINPUTWORD data bits; a plurality of subtraction blocks each coupled to a different one of the FIRSTCODE registers and to one of the addition blocks corresponding to one of the FIRSTCODE registers, one of the subtraction blocks being associated with the one of the FIRSTCODE registers having the successful comparison result and being structured to subtract the value of the successful FIRSTCODE register from the result of the corresponding addition block and to output an input address to the multiplexer; and a SYMBOL table coupled to the multiplexer to receive the input address and being structured to responsively output a corresponding resolved symbol.

The order of the addition and subtraction is not critical to the invention. Therefore, while the addition function may precede the subtraction function, the addition and subtraction functions are non-ordered according to the invention. Rather, the FIRSTCODE register may be subtracted from the SYMBOL POINTER register before the compressed data is added to the result.

According to another aspect of the invention, the invention provides a method for decompression of canonical Huffman encoded data.

According to still another aspect of the invention, a processor is coupled to the memory device and operates a logic device. The decompression device is further coupled to the memory for respectively receiving the canonical Huffman encoded data file and outputting the resolved symbols.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF PREFERRED EMBODIMENT

In the Figures, like numerals indicate like elements.

The present invention is an apparatus and method for a decompression algorithm that resolves a compressed data symbol much faster than the traditional decompression method. Traditional decompression can be implemented in either software or hardware using the same algorithm.

However, software implementations are limited to traditional decompression because the algorithm must be executed in a serial or sequential loop fashion. In contrast, the novel decompression algorithm of the invention is implemented in hardware which permits relationships between the compressed data and the tables of canonical Huffman encode data to be used to advantage. These relationships permit some operations to be executed in parallel so that the hardware implementation of the invention operates faster than the software solution.

Also, the hardware solution of the invention is optionally instantiated multiple times to provide sufficient processing power to satisfy the requirements of a host system having multiple applications requesting data simultaneously.

Figure 3:
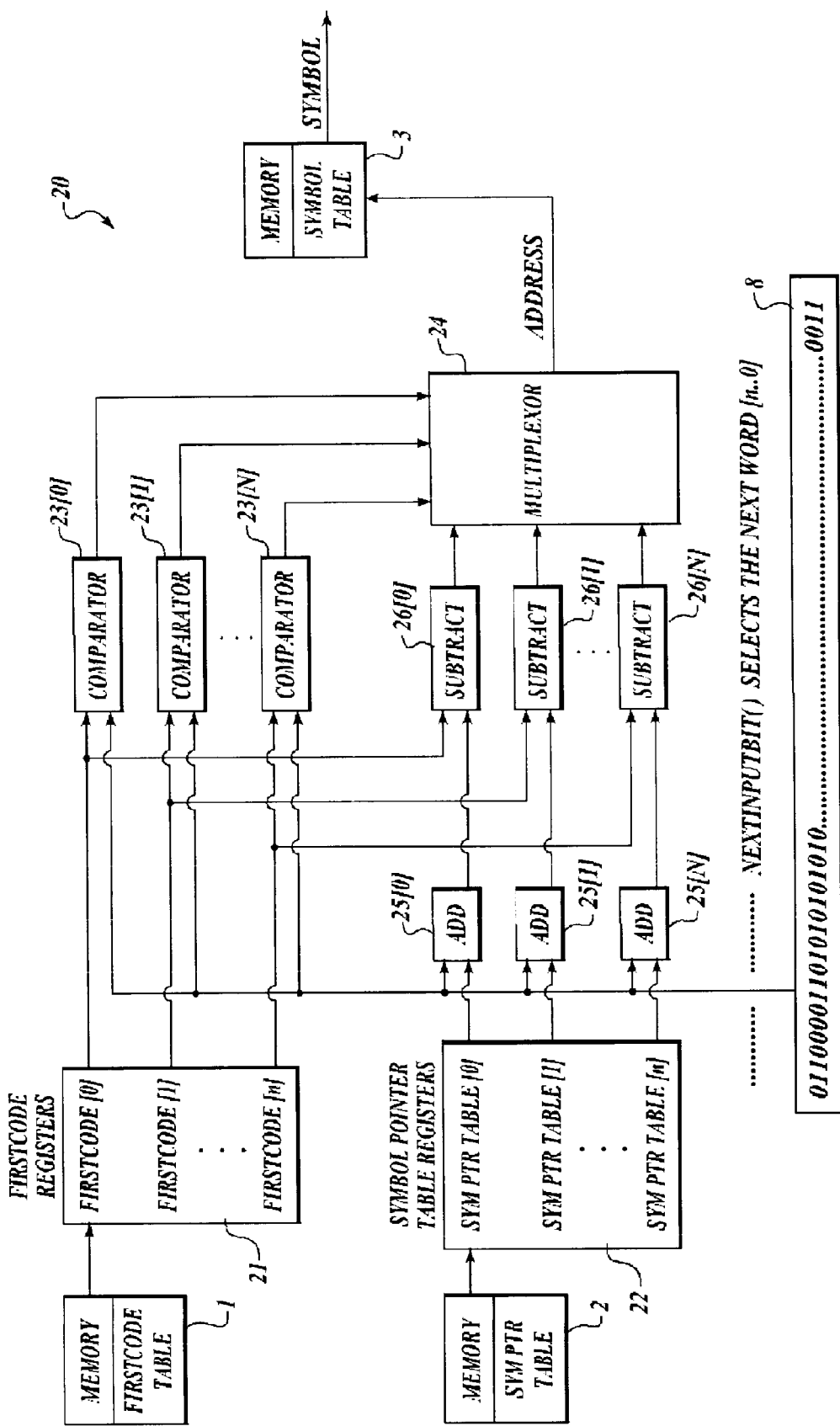
FIG. 3 is the decompression apparatus of the invention embodied as multiple instantiations of an algorithm for decompression of canonical Huffman encoded data.

FIG. 3 illustrates the decompression apparatus 20 of the invention embodied as multiple hardware instantiations of an algorithm for decompression of canonical Huffman encoded data. According to the embodiment of the invention illustrated in FIG. 3, the decompression algorithm is implemented in hardware using multiple parallel paths and functional blocks to rapidly accomplish the decompression.

The hardware-implemented decompression algorithm of the invention takes advantage of the relationships between FIRSTCODE and the compressed data bits as shown in Table 2; and FIRSTCODE and SYMBOL POINTER as shown in Table 3.

TABLE 2

FIRSTCODE and Compressed Data Bit Relationships

FIRSTCODE[0] and bit 0;
FIRSTCODE[1] and bits 0, 1;
FIRSTCODE[2] and bits 0, 1, 2; and
et cetera through FIRSTCODE[N] and bits 0, 1, . . . N.

TABLE 3

FIRSTCODE and SYMBOL POINTER Relationships

FIRSTCODE[0] and SYMBOL POINTER[0];
FIRSTCODE[1] and SYMBOL POINTER[1]; and
et cetera through FIRSTCODE[N] and SYMBOL POINTER[N].

Parallel execution of all calculations is permitted because the relationships shown in Tables 2 and 3 are fixed. Parallel execution results in the symbol being found immediately whenever a new NEXTINPUTWORD is presented, where each NEXTINPUTWORD is a string or "word" of compressed data N bits long, for example, a word 8-, 16-, 32- or 64-bits long. In other words, no iterations are required to resolve the SYMBOL, and the iterative bit comparison process required by software implementations of the traditional decompression algorithm is eliminated.

Figure 1:
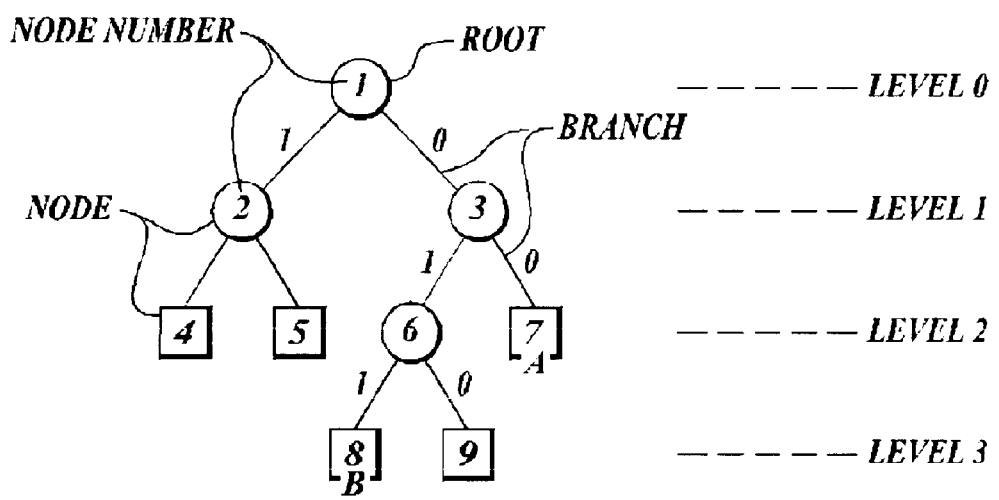
FIG. 1 is an explanatory diagram showing a code tree.
Figure 2:
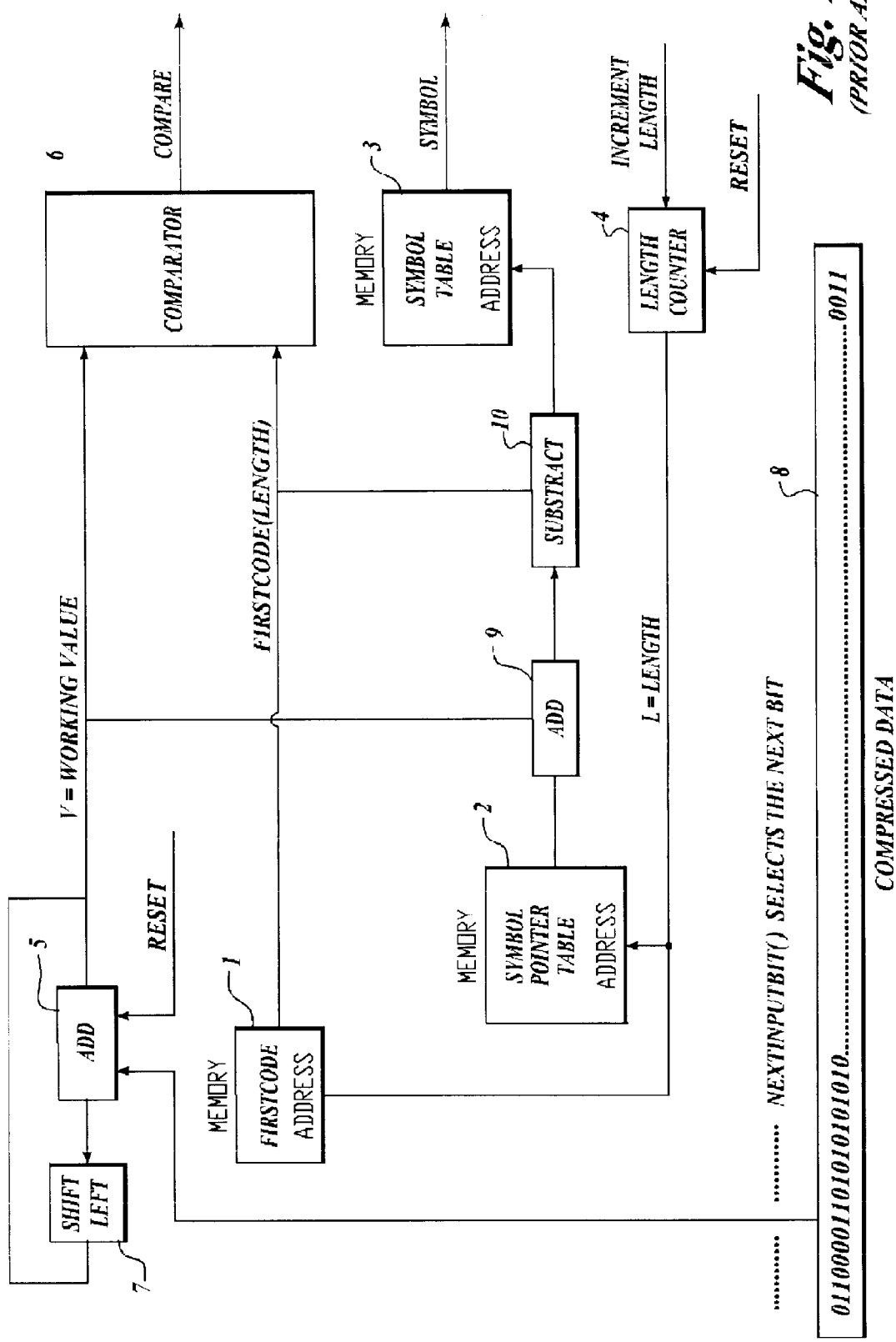
FIG. 2 is an explanatory diagram showing a traditional decoding algorithm for decompressing data encoded in a canonical Huffman form.

As is known a canonical Huffman encode file consists of the three tables: FIRSTCODE table 1, SYMBOL POINTER table 2, and SYMBOL table 3; and the compressed data 8. According to the invention, the FIRSTCODE table 1 and SYMBOL POINTER table 2 are read from memory and loaded into registers 21[0], 21[1], . . . 21[N] and 22[0], 22[1], . . . 22[N], respectively. The SYMBOL table 3 is again implemented as described in the traditional decompression algorithm of FIG. 2, i.e., as a look-up table of resolved symbols. The SYMBOL table 3 is stored in memory and accessed by address. The compressed data 8 are presented to the decompression circuit 20 as a word N bits long. Each of the FIRSTCODE registers 21[0], 21[1], . . . 21[N] is coupled to present a respective FIRSTCODE value to a respective comparator 23[0], 23[1], . . . 23[N]. The FIRSTCODE values are compared to an associated NEXTINPUTWORD bit of the compressed data 8 with all of the comparators 23[0], 23[1], . . . 23[N] operating simultaneously.

Each of the comparators 23[0], 23[1], . . . 23[N] outputs its respective comparison result to a multiplexer 24. The multiplexer 24 examines the comparison results, starting with the comparator 23[0] and progressing toward the comparator 23[N]. The first value encountered having a comparison result that is successful or TRUE is the correct solution. The input address is the non-ordered addition and subtraction of the NEXTINPUTWORD bits of the compressed data 8 and the associated FIRSTCODE values with the associated SYMBOL POINTER values. The multiplexer 24 directs a corresponding input address to the SYMBOL table 3 which responsively outputs the resolved SYMBOL.

Thus, addition and subtraction blocks 25[0], 25[1], . . . 25[N] and 26[0], 26[1], . . . 26[N], respectively, are used in decompressing the compressed data 8. A value from a SYMBOL POINTER table register 22[X] corresponding to the value from a FIRSTCODE register 21[X] having a TRUE comparison result is selected by the multiplexer 24 and added to the compressed data 8 using a corresponding addition block 25[X]. Using a corresponding subtraction block 26[X], the value from the corresponding FIRSTCODE register 21[X] is subtracted from the result of the addition, i.e., the output of the addition block 25[X]. The result of the subtraction block 26[X] represents the input address used by the multiplexer 24 to access the SYMBOL table 3. The SYMBOL table 3 outputs a symbol corresponding to the input address. In other words, the output of the subtraction block 26[X] is the input address to the corresponding symbol in the SYMBOL table 3, which outputs the resolved SYMBOL.

The invention is described as having the value from a SYMBOL POINTER table register 22[X] added to the compressed data 8, and then having the value from the corresponding FIRSTCODE register 21[X] subtracted from the result, with the result of the subtraction being the input address used by the multiplexer 24 to access the SYMBOL table 3. However, the order of addition and subtraction operations is not important and may be reversed in an alternative embodiment of the invention. In other words, the value from the FIRSTCODE register 21[X] having a successful or TRUE comparison result is subtracted from the SYMBOL POINTER table register 22[X], the result is then added to the compressed data 8. Thus, the result of the addition block 25[X], rather than the subtraction block 26[X], represents the input address used by the multiplexer 24 to access the SYMBOL table 3.

Implementation in an Enhanced Ground Proximity Warning System (EGPWS)

Various systems that provide warnings or advisory indications in the event of hazardous flight conditions are known. Among such systems are systems generally known as ground proximity warning systems (GPWS) for aircraft that serve to monitor the flight conditions of an aircraft and provide a warning if flight conditions are such that an inadvertent contact with the ground is imminent. Among the flight conditions monitored by such systems are radio altitude and rate, barometric altitude and rate, airspeed, and flap and gear positions. The aforementioned parameters are monitored, and an advisory indication or a warning is generated when the relationship between the aforementioned conditions or parameters is such that ground impact is likely to occur. Typical examples of such systems are disclosed in U.S. Pat. Nos. 3,715,718; 3,936,796; 3,958,218; 3,944,968; 3,947,808; 3,947,810; 3,934,221; 3,958,219; 3,925,751; 3,934,222; 4,060,793; 4,030,065; 4,215,334 and 4,319,218, all assigned to the assignee of the present invention and incorporated herein by reference in their entirety. Additional examples of such systems are disclosed in U.S. Pat. Nos. 3,349,751; 3,988,713; 4,189,777; 4,433,323; 4,495,483; 4,684,948; 4,849,756; 4,857,923; 4,914,436; 5,166,682; 5,196,847; 5,220,322; 5,428,354; 5,781,126; and 6,157,891, all owned by the assignee of the present invention and incorporated herein by reference in their entirety.

While the above-described systems provide advisory and warning signals in the event of proximity to terrain, such systems generate warnings based on the flight conditions of the aircraft, without utilizing navigation information. Consequently, the sensitivity of such systems is adjusted to provide adequate warnings when a hazardous flight condition exists, without generating false or nuisance warnings when there is no danger.

One attempt to correct some of the nuisance warnings when flying over terrain unique to particular geographic areas and shorter than desired warning times in other geographic areas has been to modify the warning criteria of the ground proximity warning system in accordance with the geographic location of the aircraft in order to optimize the warning criteria for the particular geographic area over which the aircraft is flying. An example of such a system is described in U.S. Pat. No. 4,567,483, which is assigned to the assignee of the present invention and is incorporated in its entirety herein by reference. In the system disclosed in U.S. Pat. No. 4,567,483, the warning criteria are optimized to suit the terrain characteristics about certain limited areas, particularly the characteristics of particular airports where nuisance warnings and other problems have been encountered.

Another approach utilizing a geographical input is used in U.S. Pat. No. 4,224,669, which is incorporated in its entirety herein by reference, wherein a memory device is employed to store minimum safe altitudes by geographic coordinate areas. A navigational computer is used to determine the position of the aircraft, and a warning is given if the aircraft descends below the stored minimum safe altitude for the coordinate area in which the aircraft is flying. The system includes a "worst case" and a "tactical" mode of operation. In the "worst case" mode, the minimum safe altitude is determined as a function of the highest terrain feature or obstacle within the geographic coordinate area of interest. In the "tactical" mode of operation, current flight conditions such as position, ground speed and ground track are used to define a minimum safe altitude based on the known height of terrain and obstacles immediately ahead of the projected flight path.

U.S. Pat. No. 4,675,823, which is assigned to the assignee of the present invention and is incorporated in its entirety herein by reference, describes a ground proximity warning system that utilizes geographic position data to alter the warning criteria according to the known height of terrain features of particular geographic areas. Briefly, determination of whether the aircraft is within a particular geographic area is provided by having the world or geographic area of interest subdivided into a plurality of zones which are further subdivided into regions and areas. Each area within a region is defined by its position within the zone and its shape, with the shape being defined as one of several standard shapes, such as a rectangle, a parallelogram, a triangle, a circle, a sector of a circle, an ellipse or other shape. The use of such a data storage format zone, region or area reduces the quantity of data required to define the various areas, and reduces the calculation time required to determine whether the aircraft is in an area that requires warning criteria modification. The use of data compression reduces the amount of storage space required to hold the zone, region and area information and the height of corresponding terrain and obstacles. However, this compressed data must be decompressed before it is used.

Figure 4:
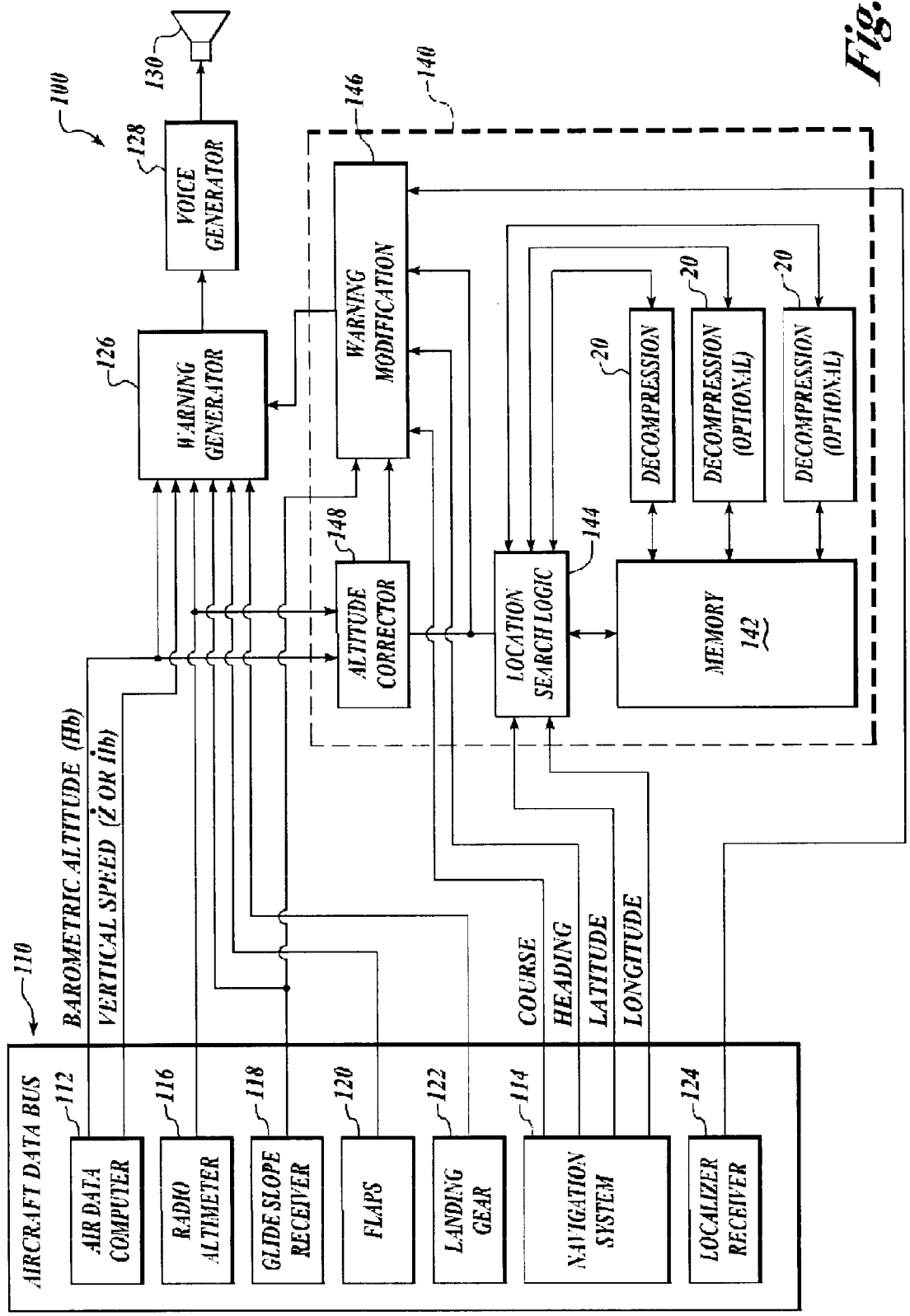
FIG. 4 is a functional block diagram illustrating one embodiment of a ground proximity warning system with geographic area determination and including the peripheral decompression apparatus of the invention.

FIG. 4 is a functional block diagram illustrating one embodiment of a ground proximity warning system with geographic area determination, also known as an enhanced ground proximity warning system (EGPWS), and including the peripheral decompression apparatus 20 of the invention, the enhanced ground proximity warning system being generally designated by the reference numeral 100. The underlying enhanced ground proximity warning system 100 is more fully described in the above incorporated U.S. Pat. No. 4,675,823. An aircraft data bus 110 provides various signals to the ground proximity warning system 100. A detailed description of the signals available to a ground proximity warning system is provided in the ARINC Characteristic 429 as published by Aeronautical Radio, Incorporated of Annapolis, Md. Included in the signals provided by the aircraft data bus 110 are: barometric and radio altitude signals; a vertical speed signal; course, heading, latitude and longitude signals; a radio glideslope signal; flap and gear position signals; and localizer receiver signals. These signals are used as inputs to a warning logic circuit, which in turn is effective to generate an advisory or warning signal whenever the various flight parameters indicate that the aircraft is in an unsafe condition with respect to the terrain. The advisory or warning signal is applied to a voice warning generator, that in turn generates a voice warning signal that results in a voice warning being annunciated by means of a cockpit speaker.

For example, the warning system 100 as embodied in FIG. 4 uses data from an air data computer 112 or from a barometric altimeter and a barometric rate circuit present on the aircraft to provide information about the barometric altitude of the aircraft and the vertical speed of the aircraft. The vertical speed may be expressed as a barometric rate, or as Z velocity, which may be obtained from an onboard inertial navigation system. Data is also received from a navigation system 114 on the aircraft to provide information about the course, heading, latitude and longitude of the aircraft. The navigation data may be obtained directly from the navigation system, which may include an inertial navigation system, a satellite navigation receiver, VLF/OMEGA, Loran C, VOR/DME or DME/DME, or from a flight management system. In addition, the warning system 100 utilizes signals from a radio altimeter 116, a glide slope receiver 118, and discrete signals from discretes 120 and 122 that indicate the position of the flaps and landing gear. Also used are signals from a localizer receiver 124, which indicates whether the aircraft is on the correct course for a landing.

The warning system 100 is described herein in an aircraft environment; however, the warning system 100 is also usable for other vehicles that must navigate around terrain, such as, for example, submarines. The signals from the air data computer 112, the radio altimeter 116, the glide slope receiver 118, and the flap and landing gear discretes 120 and 122 are applied to a warning logic circuit or warning generator 126. The warning generator 126 may form part of a system generally known as a ground proximity warning system, examples of which are disclosed in the previously referenced patents, that initiates a warning when the signals applied thereto indicate a hazardous flight condition. When such a hazardous condition is detected, a warning initiation signal is applied to a voice generator 128 which applies an appropriate voice warning, either directly, or via the aircraft intercommunication system, to a speaker transducer 130 to thereby annunciate the warning to the pilot.

The warning generator 126 initiates a warning when various hazardous flight conditions occur according to the warning system 100. Among the hazardous flight conditions that can cause a warning to be initiated are a negative climb after take-off, an insufficient terrain clearance, an excessive sink rate, an excessive closure rate, and a below glide slope approach. The criteria for initiating such warnings are defined by predetermined component values in analog warning generators, and by stored data in digital warning generators, that define the warning criteria in terms that may be graphically represented as graphs known as "warning envelopes." Examples of such warning envelopes are disclosed in U.S. Pat. No. 3,936,796, which is incorporated herein by reference.

The warning criteria, or warning envelopes, of a ground proximity warning system are tailored to maximize warning times while minimizing false or nuisance warnings. However, warning envelopes cannot be tailored that are optimum for all types of terrain, and consequently, most warning envelopes are the result of a compromise that permits satisfactory performance under most flying conditions, even though they may not be optimized for certain unusual geographic areas. Thus, there is provided a system 140 that receives signals from the navigation system 114, as well as other signals, and modifies the warning criteria or warning envelope used to initiate a warning by the warning generator 126 in accordance with the geographic location of the aircraft in order to optimize the warning envelopes for unusual terrain characteristics that occur in certain predetermined geographic areas. The system 140 includes a memory 142 that stores compressed terrain elevation data, ie., the locations and boundaries of the areas that require envelope modification, as well as the warning modifications required. Location search logic 144 is employed to monitor the position of the aircraft so as to determine whether the aircraft is in an area that requires envelope modification. If the aircraft is in such an area, the logic 144 initiates a warning modification via a warning modification circuit 146 that inhibits the modification in the event that certain other criteria are not met. The aforementioned other criteria are discussed in greater detail in U.S. Pat. No. 4,675,823. If sufficiently accurate navigation data is available, an altitude corrector 148 may be utilized to correct the barometric altitude reading to correspond to an altitude reading taken by measuring the radio altitude over terrain of known elevation. Otherwise, the warning modifications may simply be inhibited in the event of a discrepancy between the barometric altitude reading and the radio altitude reading over known terrain.

As previously stated, the memory 142 contains the locations and boundaries of the areas wherein warning envelope modification is desirable. The locations of such areas are compared with the present position of the aircraft to determine whether an envelope modification is necessary, and the nature of such a modification. However, constant comparison of the present location of the aircraft with the locations of each of the areas wherein envelope modification is required would require an excessive computing capacity or an excessive computing time that would not be compatible with the physical and time requirements of a ground proximity warning system. Consequently, rather than simply storing the locations and boundaries of the areas that require envelope modification, the world is divided into latitude bands that are further divided into zones by predetermined lines of longitude, which are further divided into regions that may contain one or more areas that require warning envelope modification, as described in greater detail in U.S. Pat. No. 4,675,823.

According to one embodiment of the invention, the decompression apparatus 20 of the invention provides a fast peripheral device coupled between the memory 142 and the main processor that operates the location search logic 144 for decompressing the compressed terrain data stored in the memory 142. The decompression apparatus 20 of the invention thereby off-loads the main processor, allowing it to operate the location search logic 144 and to do other work. The decompression apparatus 20 receives a request or command from the main processor to fetch and decompress terrain data corresponding to an area, region or zone of interest. The decompression apparatus 20 retrieves the compressed data file from the memory 142, performs the decompression function, and returns the decompressed data to the memory 142 for temporary storage. The decompression apparatus 20 may also report completion of the decompression function to the main processor. The decompressed data is thus available to the main processor upon demand.

Furthermore, the decompression algorithm of the invention when implemented in the hardware device 20 is much faster than the traditional software solution since multiple parallel paths and functional blocks are utilized to rapidly accomplish the decompression, which permits some operations to be executed in parallel rather than serial fashion. For example, software may take anywhere from 50 to 100 clocks to resolve a terrain elevation, while the hardware device 20 takes less than 8 clocks. Also, increased decompression performance is very useful for providing decompressed terrain data to multiple requesters. Thus, the hardware solution is optionally instantiated as many times as necessary to provide sufficient processing power to satisfy the requirements of the warning system 100. For example, multiple dedicated decompression peripherals 20 of the invention are optionally instantiated to further increase decompression performance.

While the preferred embodiment of the invention has been illustrated and described, it will be appreciated that various changes can be made therein without departing from the spirit and scope of the invention.

What is claimed is:

1. A decompression device for canonical Huffman encoded data, the device comprising:
    first data register means for storing a plurality of FIRST-CODE data values;
    second data register means for storing a plurality of SYMBOL POINTER data values;
    comparing means coupled for comparing different FIRST-CODE data values with corresponding bits of a string of compressed data;
    means for combining the bits of compressed data with one of the FIRSTCODE and one of the SYMBOL POINTER data values selected as a function of an output of the comparing means and outputting an address; and
    symbol table means coupled for receiving the address and outputting a corresponding symbol.

2. The device of claim 1 wherein the combining means further comprises a means for adding and subtracting the bits of compressed data and associated FIRSTCODE data values with associated SYMBOL POINTER data values.

3. The device of claim 1 wherein the combining means further comprises:
an addition means for adding the selected SYMBOL POINTER data value to the string of compressed data bits; and
a subtraction means for subtracting the selected FIRSTCODE data value from a result of the addition means.

4. The device of claim 1 wherein the combining means further comprises:
a subtraction means for subtracting the selected FIRSTCODE data value from the string of compressed data bits; and
an addition means for adding a result of the subtraction means to the selected SYMBOL POINTER data value.

5. The device of claim 1 wherein the address output by the combining means further comprises an address associated with a successful comparing of different FIRSTCODE data values with corresponding bits of a string of compressed data.

6. The device of claim 1, further comprising means for selecting one of the FIRSTCODE data values and one of the SYMBOL POINTER data values as a function of a successful comparing of one of the FIRSTCODE data values with an associated bit of the compressed data.

7. The device of claim 6, further comprising means for determining a successful comparing of one of the FIRSTCODE data values with an associated bit of the compressed data.

8. The device of claim 1 wherein the comparing means further comprises means for simultaneously comparing a plurality of the FIRSTCODE data values with a corresponding plurality of the bits of the compressed data.

9. The device of claim 1 wherein the comparing means further comprises means for sequentially examining a plurality of comparison results for determining a successful comparison.

10. The device of claim 1, further comprising means for reporting the outputting by the symbol table means of the symbol corresponding to the received address.

11. The device of claim 1, further comprising:
a memory means for storing a compressed canonical Huffman encoded data file; and
means for operating a logic device; and
wherein the decompression device is coupled to the memory means for receiving the plurality of FIRSTCODE and SYMBOL POINTER data values, decompressing compressed data, and outputting the resolved symbol.

12. A decompression device for decompressing a string of data bits compressed as canonical Huffman encoded data in a data file, wherein the data file includes (i) a string of compressed data bits, (ii) a FIRSTCODE data table, (iii) a SYMBOL POINTER data table, and (iv) a SYMBOL table, and wherein a relationship is fixed between data in the FIRSTCODE data table and the compressed data bits, and a relationship is fixed between the data in the FIRSTCODE data table and the data in a SYMBOL POINTER data table, the device comprising:
(a) a coupling structured for receiving a canonical Huffman encoded data file;
(b) a plurality of FIRSTCODE data registers coupled to receive and store data values from the FIRSTCODE data table portion of the data file;
(c) a plurality of SYMBOL POINTER data registers coupled to receive and store data values from the SYMBOL POINTER data table portion of the data file;
(d) a comparator coupled between each FIRSTCODE register and the string of compressed data bits for comparing the value stored in each FIRSTCODE data register with a corresponding bit of the string of compressed data bits;
(e) a multiplexer coupled to each comparator for determining a successful comparison result and responsively outputting a resolved symbol address associated therewith; and
(f) intercoupled addition and subtraction blocks coupled to the multiplexer and each of the SYMBOL POINTER data registers and the corresponding FIRSTCODE data registers for:
(i) adding the value stored in the SYMBOL POINTER data register associated with a successful comparison result to the corresponding bit of the string of compressed data bits,
(ii) subtracting the value stored in the FIRSTCODE data register associated with a successful comparison from the corresponding bit of the string of compressed data bits,
(iii) generating the resolved symbol address, and
(iv) outputting the resolved symbol address to the SYMBOL table portion of the data file for responsively outputting a corresponding resolved symbol.

13. The device of claim 12 wherein the intercoupled addition and subtraction blocks operate in response to an input from the multiplexer.

14. The device of claim 12 wherein the intercoupled addition and subtraction blocks are operable for generating the resolved symbol address according to one of a first structure and a second structure, wherein:
according to the first structure:
one of the addition blocks is coupled to each of the SYMBOL POINTER data registers for adding the value stored in the SYMBOL POINTER data register associated with a successful comparison to the corresponding bit of the string of compressed data bits, and
one of the subtraction blocks is coupled to each of the addition blocks and to the corresponding FIRSTCODE register and is operable in response to an input from the multiplexer to subtract the value stored in the FIRSTCODE data register associated with a successful comparison from a result of the associated addition block for generating the resolved symbol address; and
according to the second structure:
one of the subtraction blocks is coupled to each of the FIRSTCODE data registers for subtracting the value stored in the FIRSTCODE data register associated with a successful comparison from the string of compressed data bits in response to an input from the multiplexer, and
one of the addition blocks is coupled to each of the SYMBOL POINTER data registers for adding the value stored in the SYMBOL POINTER data register associated with a successful comparison to the result of the associated subtraction block for generating the resolved symbol address.

15. The device of claim 12, further comprising:
a memory device having stored therein a string of data bits compressed as canonical Huffman encoded data in a data file; and
a processor coupled to the memory device and operating a logic device;

wherein the coupling of the decompression device is further coupled to the memory for respectively receiving the data file and for outputting the resolved symbol.

16. The device of claim 15 wherein the decompression device further comprises a coupling for receiving an instruction from the processor.

17. A device for decompression of compressed data in a canonical Huffman encoded data file, wherein the data file includes: a string of compressed data bits, a FIRSTCODE data table, a SYMBOL POINTER data table, and a SYMBOL table; and wherein a relationship is fixed between FIRSTCODE and the compressed data bits according to FIRSTCODE[0] and bit 0, FIRSTCODE [1]and bits 0, 1, FIRSTCODE[2] and bits 0, 1, 2, through FIRSTCODE[N] and bits 0, 1, 2, . . . N; and a relationship is fixed between FIRSTCODE and SYMBOL POINTER according to FIRSTCODE[0] and SYMBOL POINTER[0], FIRSTCODE[1] and SYMBOL POINTER[1], through FIRSTCODE[N] and SYMBOL POINTER[N], the device comprising:

a plurality of FIRSTCODE registers each having a FIRSTCODE value associated therewith;

a plurality of SYMBOL POINTER registers each having a SYMBOL POINTER value associated therewith;

a plurality of comparators each coupled to a different FIRSTCODE register to accept a FIRSTCODE value therefrom and coupled to accept a string of compressed data bits from a memory having compressed canonical Huffman encoded data stored therein, the comparators being structured to simultaneously compare the FIRSTCODE values with corresponding bits of the string of compressed data bits;

a multiplexer coupled to accept a result of each of the comparators, the multiplexer being structured to sequentially examine the results and to select a successful comparison result;

a plurality of addition blocks each coupled to an output of the multiplexer and a different one of the SYMBOL POINTER registers, one of the addition blocks being associated with one of the SYMBOL POINTER registers corresponding to one of the FIRSTCODE registers having the successful comparison result and being structured to add the value from the corresponding SYMBOL POINTER register to the string of compressed data bits;

a plurality of subtraction blocks each coupled to a different one of the FIRSTCODE registers and to one of the addition blocks corresponding to one of the FIRSTCODE registers, one of the subtraction blocks being associated with the FIRSTCODE register having the successful comparison result and being structured to subtract the value of the successful FIRSTCODE register from the result of the corresponding addition block and to output an address to the multiplexer; and a SYMBOL table coupled to the multiplexer to receive the address, the SYMBOL table being structured to output a resolved symbol associated with the received address.

18. The device of claim 17, further comprising a memory containing a canonical Huffman encoded data file, the memory being coupled to each of the plurality of FIRSTCODE registers for outputting the FIRSTCODE value associated therewith, and coupled to each of the plurality of SYMBOL POINTER registers for outputting the SYMBOL POINTER value associated therewith, and coupled to the multiplexer to receive the address and being structured to responsively output the resolved symbol associated with the received address.

19. The device of claim 17 wherein:

each of the plurality of subtraction blocks is coupled to a different one of the FIRSTCODE registers for subtracting the value of the successful FIRSTCODE register from the string of compressed data bits in response to an input from the multiplexer; and each of the plurality of addition blocks each coupled to an output of the multiplexer and a different one of the SYMBOL POINTER registers, one of the addition blocks being associated with one of the SYMBOL POINTER registers corresponding to the successful FIRSTCODE register and being structured to add the value from the corresponding SYMBOL POINTER register to the result of the corresponding addition block and to output the address to the multiplexer.

20. A method for decompression of canonical Huffman encoded data, the device comprising:

receiving a file of canonical Huffman encoded data, the file including a string of compressed canonical Huffman encoded data bits, a table of FIRSTCODE data values, a table of SYMBOL POINTER data values, and a table of resolved symbols;

storing the FIRSTCODE data values in FIRSTCODE data registers;

storing the SYMBOL POINTER data values in SYMBOL POINTER data registers;

comparing the FIRSTCODE data values with corresponding bits of the compressed data;

examining results of comparing the FIRSTCODE data values with corresponding bits of the compressed data to determine a match;

combining the bits of compressed data with one of the FIRSTCODE data values and one of the SYMBOL POINTER data values selected as a function of determining a match;

generating an address; and outputting from the table of resolved symbols a symbol corresponding to the generated address.

21. The method of claim 20 wherein combining the bits of compressed data with one of the FIRSTCODE data values and one of the SYMBOL POINTER data values further comprises adding and subtracting of the bits of the compressed data and associated FIRSTCODE data values with associated SYMBOL POINTER data values.

22. The method of claim 20 wherein combining the bits of compressed data with one of the FIRSTCODE data values and one of the SYMBOL POINTER data values further comprises:

adding to the string of compressed data bits a SYMBOL POINTER data value associated with a successful result of comparing the FIRSTCODE data values with corresponding bits of the compressed data; and subtracting a FIRSTCODE data value from a result of the adding.

23. The method of claim 22 wherein generating the address further comprises generating the address as a function of subtracting the FIRSTCODE data value from the result of the adding.

24. The method of claim 20 wherein combining the bits of compressed data with one of the FIRSTCODE data values and one of the SYMBOL POINTER data values further comprises:

subtracting a FIRSTCODE data value from the string of compressed data bits; and adding a SYMBOL POINTER data value associated with a successful result of comparing the FIRSTCODE data values to a result of the subtracting.

25. The method of claim 24 wherein generating the address further comprises generating the address as a function of adding the SYMBOL POINTER data value to the result of the subtracting.

26. The method of claim 20 wherein generating an address further comprises generating an address as a function of combining the bits of compressed data with one of the FIRSTCODE data values and one of the SYMBOL POINTER data values.

27. The method of claim 20 wherein comparing the FIRSTCODE data values with corresponding bits of the compressed data further comprises simultaneously comparing two or more of the FIRSTCODE data values with corresponding bits of the compressed data.

28. The method of claim 20 wherein examining results of comparing the FIRSTCODE data values with corresponding bits of the compressed data further comprises sequentially examining a plurality of comparison results for a match between one of the FIRSTCODE data values and a corresponding one of the bits of the compressed data.

29. The method of claim 20, further comprising:

receiving an instruction from a processor to decompress a string of data bits as compressed canonical Huffman encoded data;

receiving the file of canonical Huffman encoded data from a memory associated with the processor; and operating the method for decompression responsively to the instruction.

30. The method of claim 29, further comprising outputting the resolved symbols to the memory.

* * * * *